US008214715B1

(12) United States Patent
Haiut

(10) Patent No.: US 8,214,715 B1
(45) Date of Patent: Jul. 3, 2012

(54) HARDWARE IMPLEMENTATION OF QPP INTERLEAVER

(75) Inventor: Moshe Haiut, Ramat Gan (IL)

(73) Assignee: Marvell International Ltd., Hamilton (BM)

(*) Notice: Subject to any disclaimer, the term of this patent is extended or adjusted under 35 U.S.C. 154(b) by 929 days.

(21) Appl. No.: 12/285,992

(22) Filed: Oct. 17, 2008

Related U.S. Application Data

(60) Provisional application No. 60/980,626, filed on Oct. 17, 2007.

(51) Int. Cl.
    *G06F 11/00* (2006.01)
(52) U.S. Cl. .................. 714/752; 375/316
(58) Field of Classification Search ............. 714/752; 375/316
    See application file for complete search history.

(56) References Cited

U.S. PATENT DOCUMENTS

| 2008/0172590 A1* | 7/2008 | Shen et al. ............ 714/755 |
| 2009/0103653 A1* | 4/2009 | Haiut .................... 375/316 |
| 2009/0138668 A1* | 5/2009 | Blankenship .......... 711/157 |

* cited by examiner

*Primary Examiner* — Philip Guyton

(57) ABSTRACT

A hardware implementation of a QPP interleaved address generator, or QPP interleaver, for use in a QPP turbo decoder uses state machines to determine BCJR engine QPP interleaved row and column addresses used by a soft-bit decoder operating in interleaved half-iteration alpha scan mode or interleaved half-iteration beta scan mode, as well as during non-interleaved half-iterations, if desired. Because QPP interleaving is pseudorandom in nature, the QPP address generator state machines leverage off knowledge of previous row/column addresses generated, as well as knowledge of the maximum row/column dimensions of the systematic soft-bit data store, to reduce the complexity of the processing performed. The described QPP address generator may be implemented in hardware with reduced hardware footprint, reduced power consumption, less heat production and an improved time response. Generated addresses may be provided to BCJR engines directly, or used to retrieve stored systematic soft-bits provided to the respective BCJR engines.

41 Claims, 8 Drawing Sheets

HARDWARE IMPLEMENTATION OF QPP INTERLEAVER

INCORPORATION BY REFERENCE

This application claims the benefit of U.S. Provisional Application No. 60/980,626, "HARDWARE IMPLEMENTATION OF QPP INTER-LEAVER," filed by Moshe Haiut on Oct. 17, 2007, which is incorporated herein by reference in its entirety.

BACKGROUND

Radio frequency (RF) digital data transmissions may be corrupted by a wide variety of interferences sources. For example, sources of RF distortion may include RF signals emitted by natural and man-made RF sources as well as multipath sources of RF distortion created by the transmitted signal itself as portions of the transmitted signal reflect off physical objects along a transmission path. Such RF signals create background noise from which the original RF transmission must be extracted, and/or may constructively, and/or destructively, interfere with the original signal. The impact of such RF distortion on a digital data transmission embedded within an RF signal may be severe, especially when a received RF signal is weak, i.e., a received signal has a low signal-to-noise ratio.

Turbo coding of an outgoing digital data stream is one technique that may be used to mitigate the effect of RF distortion on a digital data transmission embedded within an RF signal. For example, emerging communications standards, e.g., 3rd Generation Partnership Project (3GPP) Long Term Evolution (LTE) and LTE advanced standards, require that compliant transceivers apply turbo coding to an outgoing data packet prior to transmission.

A turbo encoder, included in a transmitting device, may include two recursive systematic convolutional (RSC) encoders. The first RSC encoder may take as input a data block containing an ordered set of bits in the original data block bit order, the second RSC encoder may take as input bits from the same data block after the data block has been passed through a turbo interleaver, $\pi$. The turbo interleaver, $\pi$, is a key component in the turbo code design. It is responsible for scrambling the input block in a pseudo-random fashion, thus providing an interleaved data block with good weight distribution, and hence, characteristics that support error-correcting.

The turbo encoder output mandated by 3GPP LTE standards includes three subblocks. A first subblock includes systematic bits, each systematic bit corresponding to a bit in the original data block received by the turbo encoder, a second subblock includes parity bits generated by the first RSC encoder engine within the turbo encoder that processes data bits in original order, and a third subblock includes parity bits generated by the second RSC encoder engine within the turbo encoder that processes data bits in an interleaved order.

A conventional turbo decoder, included within a receiving device, may include two RSC decoders, each corresponding to the two RSC encoders of the turbo encoder, addressed above. The first RSC decoder may take as input the systematic bits and the parity bits produced by the first RSC encoder. The second RSC decoder may take as input the systematic bits in an interleaved order, as determined by a decoder interleaver that uses same turbo interleaver, $\pi$, and the parity bits produced by the second RSC encoder. In each iteration of the decoding process, each RSC decoder may output an improved estimate, e.g., extrinsic data in the form of a log-likelihood ratio (LLR), of the actual bit value represented by each systematic bit. Once the estimates generated by the two RSC decoders converge, or once a predetermined number of decoding cycles has been performed, the final improved estimates may be interpreted, and transmitted from the decoder to a receiver signal processor as an output stream of decoded bit estimates.

The data bit-rates required by emerging communications standards, such as 3GPP LTE, may reach over 100 Mbit/sec. For example, the multiplexing and channel coding standard adopted as part of the 3GPP LTE standards, e.g., 3GPP Technical Specification (TS) 36.212, allows data packets that may be one of 188 different sizes, ranging between 40-bit and 6144-bit, packages. Turbo decoder designs configured to support such high data rates typically include dedicated hardware that supports parallel processing. Such designs may include multiple Bahl, Cocke, Jelinek and Raviv (BCJR) decoders, or BCJR engines, operating in parallel to process systematic bits contained in a common memory to produce iteratively improved bit estimates, as described above.

A quadratic permutation polynomial (QPP) interleaver scheme was defined by the 3GPP LTE standard to allow a hardware architecture to use a common memory shared by a number of BCJR processors without memory access conflicts.

The turbo-decoding algorithm consists of multiple iterations, each of which consists of a non-interleaved half-iteration, followed by an interleaved half-iteration. Each half-iteration includes a beta scan, in which the systematic bits are processed in a reverse order, i.e., from last to first, followed by an alpha scan, in which the systematic bits are processed in a forward order, i.e., from first to last. According to the QPP interleaving approach, a data packet received by a receiver may be stored as a two-dimensional array, with a number of rows, w, and a number of columns, b. For example, a QPP turbo interleaver, $\pi$, may multiplex rows, w, in a pseudo-random manner for each half-iteration, and may multiplex columns between BCJR engines in a pseudo-random manner that changes every scan cycle.

According to the QPP approach, the respective BCJR engines are synchronized, each BCJR engine processing only data stored at one column address, $\lambda$, within the row identified by row address $\Psi$ during each scan cycle. The QPP function guarantees that multiple BCJR engines may access, during each scan cycle, the row/column data that each requires, free of memory access conflicts. However, the straight forward approach for implementing a QPP row and column address generator, or QPP interleaver, capable of providing service to all BCJR engines requires a huge amount of logic that consumes silicon area. This is because, for each BCJR processor, each scan cycle, the QPP function requires calculation of a new row/column address based on equation 1, presented below.

$$I(x+b^*w) = [K1^*(x+b^*w) + K2^*(x+b^*w)^*(x+b^*w)] \% K \qquad \text{Eq. 1}$$

Where K1, K2, and K can be large integers.
Such a straight forward implementation, e.g., in hardware on an integrated circuit chip, would require at least 4 multipliers and one divider for each BCJR processor, resulting in a QPP turbo decoder integrated circuit with a large integrated circuit footprint, increased power consumption, increased heat generation and reduce response time.

SUMMARY

Aspects of this disclosure can provide methods and apparatus that allow implementation of a QPP interleaved row address and column address generator, or QPP interleaver, capable of efficiently generating row/column addresses for a QPP turbo decoder that has a reduced hardware footprint, reduced power consumption, less heat production and an improved time response.

A hardware implementation of a QPP interleaved address generator is described for use in a QPP turbo decoder. The QPP interleaved address generator uses state machines to determine QPP interleaved row and column addresses that may be used by BCJR engines within a soft-bit decoder. The QPP address generator state machines may generate row and column addresses to support interleaved half-iteration alpha scan mode and interleaved half-iteration beta scan mode, as well as during non-interleaved half-iterations, if desired. The state machines are capable of providing each BCJR engine with a QPP interleaved row address and column address each scan cycle.

Within one example embodiment of the described QPP interleaved address generator, no multipliers and no dividers are used by the state machine logic, only accumulators and adders are used. The state machine based approach takes advantage of the fact that the inter-leaved addresses are based on consecutive scanning, i.e., the index parameter of the interleaver function is incremented by 1 or decremented by 1 every scan cycle. Hence the logic performs a recursive calculation that leverages off knowledge of previous row/column addresses generated, as well as knowledge of the maximum row/column dimensions of the systematic soft-bit data store, to reduce the complexity of the processing performed. The result is an efficient QPP address generator that may be implemented in hardware with reduced hardware footprint, reduced power consumption, less heat production and an improved time response.

In one example embodiment, the described QPP interleaved address generator may be configured to provide generated QPP row and column addresses directly to each BCJR engine, thereby allowing the BCJR engines to access a shared systematic soft-bit data store without encountering memory access conflicts. In another example embodiment, the described QPP interleaved address generator may be configured to use the generated QPP row and column addresses to efficiently retrieve soft-bit data from the shared systematic soft-bit data store and may then provide each BCJR engine with the appropriate soft-bit data.

In one example embodiment a turbo code decoding unit is described that may include, an address generator that may include a state machine that may determine a row address for a plurality of stored systematic soft-bits processed during a scan cycle of a half-iteration scan, and at least one convolutional decoder engine, each decoder engine processing during the scan cycle a soft-bit identified, in part, by the determined row address, in which the state machine may determine a row address for each successive scan cycle of the half-iteration scan in a QPP interleaved order.

In another example embodiment, a method of QPP turbo decoding a received block of systematic soft-bits is described that may include, determining, based on the output of a state machine, a row address for a plurality of stored systematic soft-bits to be processed during a current scan cycle of a half-iteration scan and processing with a convolutional decoder a soft-bit identified, in part, by the determined row address, in which the state machine may determine a row address for each successive scan cycle of the half-iteration scan in a QPP interleaved order.

In yet another example embodiment, a method of QPP turbo decoding a received block of systematic soft-bits is described that may include, setting a processing mode of a state machine, configuring control parameters of the state machine based a size of a received subblock of systematic soft-bits and the processing mode, generating, via the state machine, a row address and a first column address based, in part, on the value of a last determined row address, generating, via the state machine, multiple remaining column addresses based, in part, on the value of the first column address, processing each systematic soft-bit identified with a unique line address/column address combination with one of a plurality of convolutional decoders, and improving extrinsic data for a soft-bit based on processing performed by a BCJR processing each respective soft-bit.

BRIEF DESCRIPTION OF THE DRAWINGS

Example embodiments of an RF receiver turbo decoding unit with a state machine based QPP address generator, or QPP interleaver, will be described with reference to the following drawings, wherein like numerals designate like elements, and wherein.

DETAILED DESCRIPTION OF EMBODIMENTS

Figure 1:
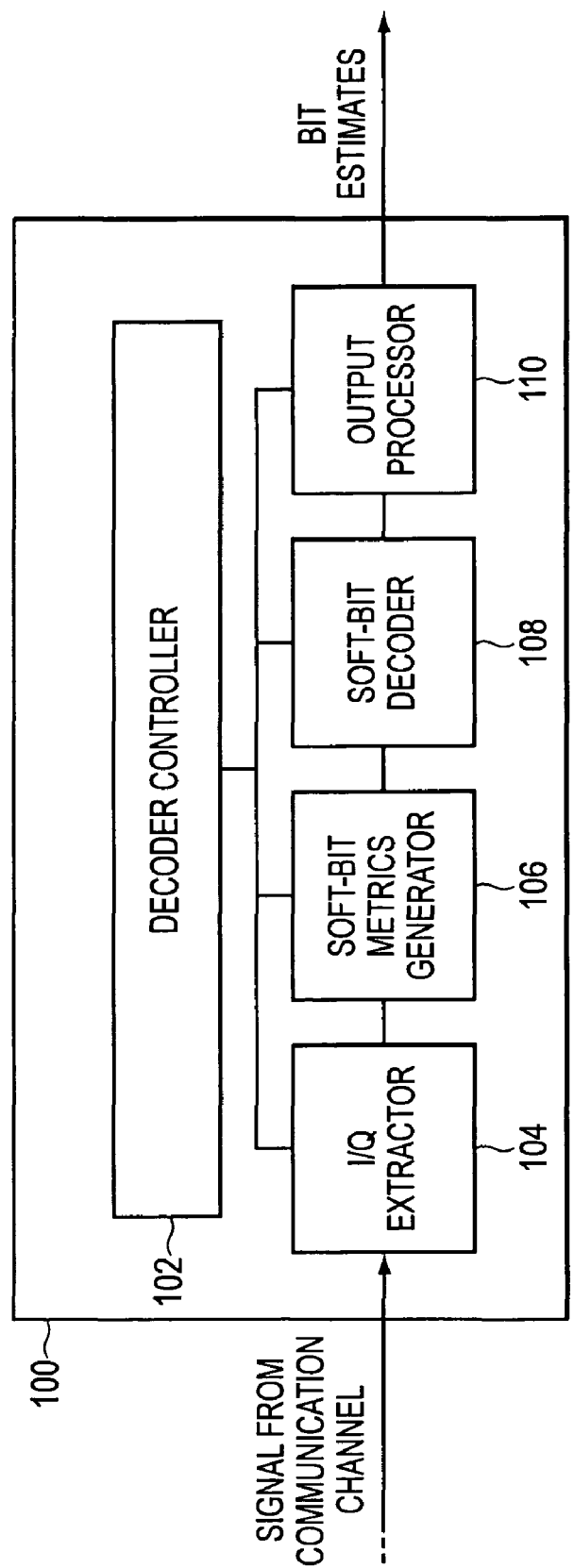
FIG. 1 is a block diagram of an example RF receiver turbo decoding unit with a soft-bit decoder that includes a QPP address generator.

FIG. 1 is a block diagram of an example turbo code decoding unit with a turbo code soft-bit decoder that includes a QPP address generator, or QPP interleaves. Such a turbo code decoding unit may be included in any RF receiver device, or in the receiver portion of any RF transceiver device. The turbo code decoding unit may be used to extract a stream of digital data encoded within a baseband frequency analog signal downconverted from a received RF signal. As shown in FIG. 1, turbo decoder 100 may include a decoder controller 102, an in-phase/quadrature (I/Q) extractor 104, a soft-bit metrics generator 106, a soft-bit decoder 108, and an output processor 110.

In operation, decoder controller 102 may receive and store control parameters from, for example, an RF communication device signal processor that controls operation of a receiver portion of an RF communication device, such as an RF receiver device or an RF transceiver device. Further, decoder controller 102 may communicate with each of I/Q extractor 104, soft-bit metrics generator 106, soft-bit decoder 108, and output processor 110 to provide the respective modules with control parameters that the respective modules may use to perform their respective signal processing functions.

I/Q extractor 104 may receive a baseband analog signal, for example, that has been downconverted from a received RF signal by other components in the RF receiver, and may extract in-phase and quadrature (I/Q) components from the received baseband analog signal. These signal I/Q components may be passed to soft-bit metrics generator 106.

Soft-bit metrics generator 106 may receive the extracted in-phase and quadrature (I/Q) components and may generate soft-bit estimates of the transmitted bits based on the I/Q information received and the receiver's adopted modulation approach. For example, based on the I/Q values received from I/Q extractor 104, soft-bit metrics generator 106 may generate an 8-bit series of 0's and 1's that corresponds to each bit within a received systematic bit subblock, a received non-interleaved parity subblock and an interleaved parity subblock. These systematic soft-bits, non-interleaved parity soft-bits and interleaved parity soft-bits may be passed to soft-bit decoder 108.

Details related to an example soft-bit decoder 108 are described in greater detail with respect to FIG. 2, below. In general, soft-bit decoder 108 may receive systematic, non-interleaved parity and interleaved parity soft-bits from soft-bit metrics generator 106 and may process the soft-bits using a turbo decoding process. Soft-bit decoder 108 may include a QPP address generator that implements an interleaving process that is matched to the QPP interleaver used by the turbo encoder of the transmitter device which encoded and transmitted the received RF signal from which the systematic soft-bits were derived, as described above. Soft-bit decoder 108 may use multiple (BCJR) decoders, or BCJR engines, to iteratively improve extrinsic data for each soft-bit, e.g., in the form of a log-likelihood ratio (LLR) or other value, that provides measure of likelihood regarding whether the soft-bit should be interpreted as a '0' or a '1.' In each iteration of the decoding process, the BCJR engines may output improved soft-bit extrinsic data. Once the extrinsic data generated by the two convolutional decoders converge, or a predetermined number of decoding cycles has been performed, the systematic bits and extrinsic data may be passed to output processor 110.

Output processor 110 may receive the systematic soft-bits, and final soft-bit extrinsic data, and parity data and may process the data to make a final determination regarding whether each soft-bit systematic bit should be interpreted as a '0' or a '1.' Based on the analysis of data received from soft-bit decoder 108, output processor 110 may generate a stream of bit best estimates, also referred to as symbol decisions, or hard-bits, that represent the final output of turbo decoding unit 100. The generated data stream may be transmitted to an RF receiver signal processor for further processing and/or transmitted to other components within the RF receiver device.

Figure 2:
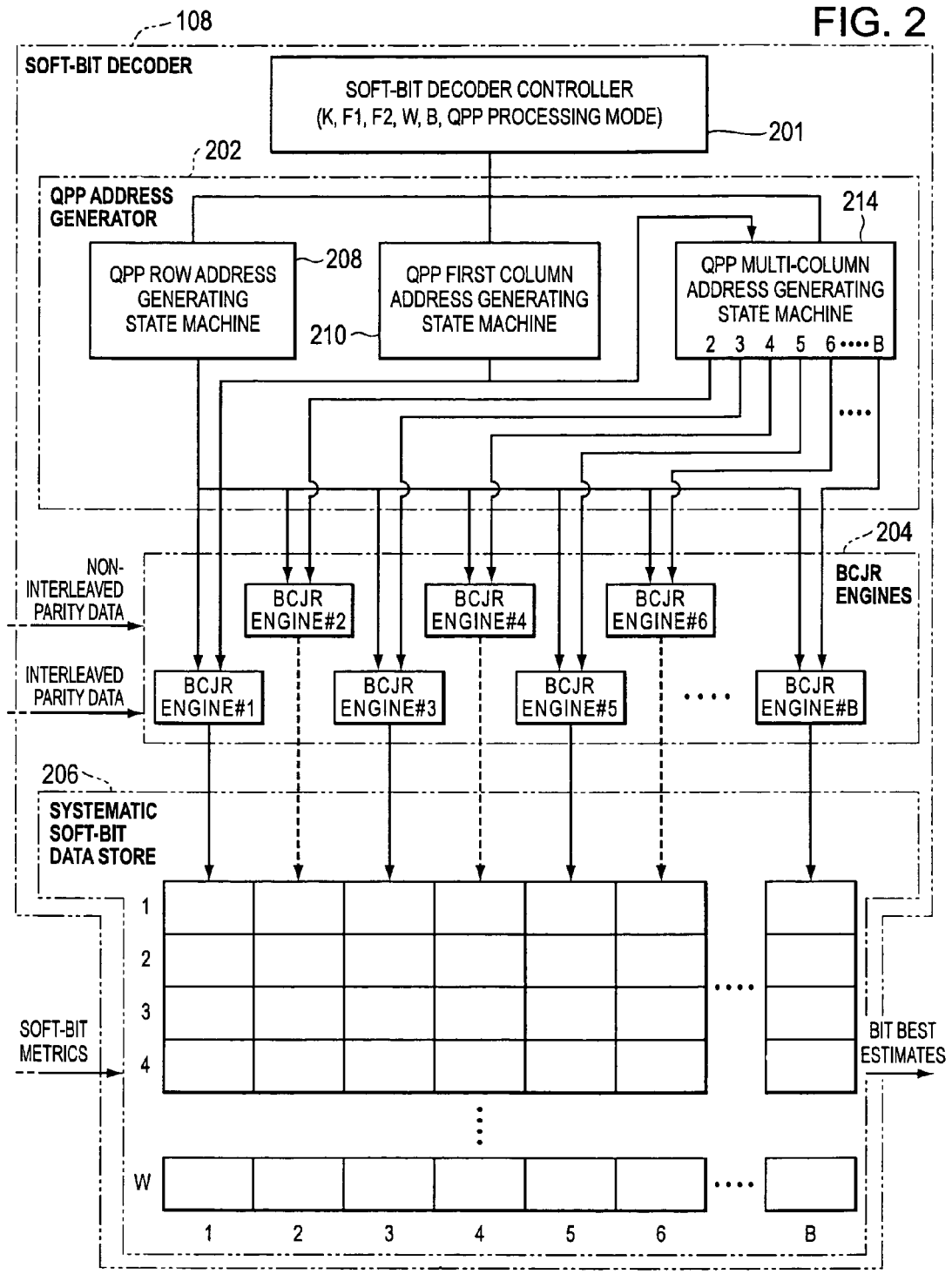
FIG. 2 is a detail block diagram of the example soft-bit decoder with QPP address generator introduced in FIG. 1.

FIG. 2 is a detail block diagram of the example soft-bit decoder 108 with QPP address generator introduced in FIG. 1. As shown in FIG. 2, soft-bit decoder 108 may include a soft-bit decoder controller 201, QPP address generator 202, multiple BCJR engines 204 and a systematic soft-bit data store 206. QPP address generator 202 may include a QPP row address generating state machine 208, a QPP first column address generating state machine 210, and a QPP multi-column address generating state machine 214. Although not shown in FIG. 2, soft-bit decoder 108 may also include data storage for alpha, beta and extrinsic data generated by the respective BCJR engines as a result of each forward pass, or alpha scan, and each reverse scan, or beta scan performed by the BCJR engines 204.

In operation, soft-bit decoder controller 201 may receive configuration and control parameters from decoder controller 102, and may use the receiver parameters to control operation of other modules within soft-bit decoder 108. Such configuration and control parameters may include a number of bits, K, represented within a received systematic bit subpacket, a first interleave parameter, f1, a second interleave parameter, f2, a number of rows that should be used to store a received systematic bit subpacket within systematic soft-bit data store 206, a number of columns that should be used to store a received systematic bit subpacket within systematic soft-bit data store 206. Soft-bit decoder controller 201 may monitor operation of QPP address generator 202 and BCJR engines 204 and may control operation of the respective modules by setting a QPP processing mode, e.g., non-interleaved beta scan, non-interleaved alpha scan, interleaved beta scan, interleaved alpha scan, terminate decoding, etc.

QPP address generator 202 may include a QPP row address generating state machine 208, a QPP first column address generating state machine 210, and a QPP multi-column address generating state machine 214. The QPP address generator may be able to provide the BCJR engines with conflict free memory access to systematic bits stored in systematic soft-bit data store, during both interleaved and non-interleaved, alpha and beta scans. QPP address generator 202 uses state machines, rather than straight forward calculations to generate QPP based row and column addresses. The state machines leverage off knowledge of the row address and first column address processed in a previous processing cycle to determine the next row and column addresses for the next processing cycle. The approach allows QPP interleaved row and column addresses to be generated with reduced processing. Further, hardware implementations of the QPP address generating state machine may be implement using fewer hardware components and with reduced chip footprint. Details related to the QPP address generator state machines are provided below with respect to FIG. 3 through FIG. 9.

As described above, the multiplexing and channel coding standard adopted as part of the 3GPP LTE standards, e.g., 3GPP Technical Specification (TS) 36.212, allows data packets that may be one of 188 different sizes, ranging between 40-bit and 6144-bit, packages. Table 1, below, provides a listing of the 188 different packet sizes, and corresponding QPP interleaving parameters f1 and f2, assigned by the LTE standard for each packet size. Although the LTE standards require that the systematic bits be processed as a table of columns and rows, the standard only defines a maximum number of rows, w, i.e., $W_{max}=384$ and a maximum number of columns, b, i.e., $b_{max}=16$, that corresponds to the maximum data packet size of 6144 bits, and does not dictate the precise number of columns and rows that should be used for each of the 188 data packet sizes.

Further, using the turbo decoding approach, the turbo decoding process may include multiple processing iterations, each iteration resulting in an incremental improvement in the extrinsic data for each systematic bit, i.e., the system obtains improved confidence regarding whether each respective systematic bit should be declared to be a hard-bit '0' or a hard-bit '1.' Once a sufficient level of confidence in the extrinsic data has been achieved, or a maximum number of decoder processing iterations have been performed, the decoding process is terminated and the soft-bits and resulting extrinsic data are passed to output processor 110, to be declared either a hard-bit '0' or a hard-bit '1.'

BCJR Engines 204 may include multiple BCJR convolutional decoders. During the decoding of a newly received set of data packet systematic bits, each convolutional BCJR may perform multiple correlation iterations based on data addresses provided by QPP address generator 202. For example, each decoder iteration may include a non-interleaved half-iteration and an interleaved half-iteration. Each half-iteration may include a reverse scan, or beta scan, and a forward scan, or alpha scan. Each scan may include multiple cycles, one cycle per row in the stored systematic bit data.

During a single cycle, multiple BCJR engines may work in parallel to process a single row of systematic bits in the stored systematic bit data. In one example embodiment of soft-bit decoder 108, each BCJR engine may determine which systematic bit it should process in the next processing cycle based on a row address and column address provided by QPP address generator 202. In another example embodiment of soft-bit decoder 108, the QPP address generator 202, after having determined a row/column address for each BCJR, may retrieve the systematic bits for the identified row, and may provide each respective BCJR with the systematic bit that should be processed in the next processing cycle.

The next row/column address provided by the QPP address generator to a BCJR engine may depend on the current operating mode of the soft-bit decoder 108. For example, when operating in non-interleaved/alpha scan mode, the columns/rows of the systematic table may be addressed in a sequential forward order, i.e., the next systematic bit to be processed by a BCJR processor may be determined by incrementing the current row, since each BCJR processes the same column for the duration of the non-interleaved half-iteration. When operating in non-interleaved/beta scan mode, the columns/rows of the systematic table may be addressed in a sequential reverse order, i.e., the next systematic bit to be processed by a BCJR processor may be determined by decrementing the current row, since each BCJR processes the same column for the duration of the non-interleaved half-iteration.

However, when operating in interleaved mode, during an interleaved half-iteration, the next row to be processed and the assignment of columns within the selected row are both pseudo-randomly interleaved in accordance with the QPP interleaving algorithm. Therefore, when operating in interleaved/beta scan mode, the next row of the systematic table may be determined using the state machine logic of QPP row address generating state machine 208, QPP first column address generating state machine 210, and QPP multi-column address generating state machine 210, which efficiently replicate the pseudo-random QPP selection process used to generate the interleaved parity bits generated by the QPP turbo encoder of the transmitting device and included in the transmitted signal. As described in detail below, the initialized parameters used in the QPP address generator state machine may vary depending on whether soft-bit decoder 108 is operating in alpha scan or beta scan mode and whether soft-bit decoder 108 is operating in interleaved or non-interleaved mode.

Each decoder half-iteration may include an alpha scan and a beta scan. At the start of a decoder half-iteration, a decoder beta scan may commence that includes multiple beta scan cycles. During each beta scan cycle, one row of systematic data may be processed. In each beta scan cycle, each of the BCJR engines may process a single systematic soft-bit, a corresponding parity soft-bit and corresponding extrinsic data generated for the systematic soft-bit during the last decoder iteration to produce revised, i.e., improved, extrinsic data for the respective soft-bits that may be stored in association with the respective systematic soft-bits. Following completion of a beta scan cycle, a new beta scan cycle may be initiated until all rows of systematic data have been processed, at which time the decoder half-iteration beta scan is completed.

TABLE 1

Turbo code internal interleaver parameters

| i | $K_i$ | $f_1$ | $f_2$ |
|---|---|---|---|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 160 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |
| 26 | 240 | 29 | 60 |
| 27 | 248 | 33 | 62 |
| 28 | 256 | 15 | 32 |
| 29 | 264 | 17 | 198 |
| 30 | 272 | 33 | 68 |
| 31 | 280 | 103 | 210 |
| 32 | 288 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 512 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |

TABLE 1-continued

Turbo code internal interleaver parameters

| i | $K_i$ | $f_1$ | $f_2$ |
|---|---|---|---|
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 217 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2112 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 120 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 480 |
| 165 | 4672 | 37 | 146 |
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 158 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6080 | 47 | 190 |
| 188 | 6144 | 263 | 480 |

Upon completion of a decoder half-iteration beta scan, a decoder half-iteration alpha scan may commence that includes multiple alpha scan cycles. In each alpha scan cycle, each of the BCJR engines may process a systematic soft-bit, a corresponding parity soft-bit and corresponding extrinsic data generated for the systematic soft-bit during the last half-iteration beta cycle to produce revised, i.e., improved, extrinsic data for the respective soft-bits that may be stored in association with the respective systematic soft-bits. Following completion of an alpha scan and a beta scan for a decoder non-interleaved half-iteration, and completion of an alpha scan and a beta scan for a decoder interleaved half-iteration, the decoder iteration is complete.

Following completion of a decoder iteration, the soft-bit decoder controller may assess the respective extrinsic data to determine whether the extrinsic data has sufficiently converged, so that the decoding process may be terminated. For example, if the soft-bit decoder controller determines that a sufficient number of systematic bits may be converted with high confidence in the resulting hard-bit value, the decoding process may be terminated and the resulting systematic soft-bits may be passed to output processor 110.

Figure 3:
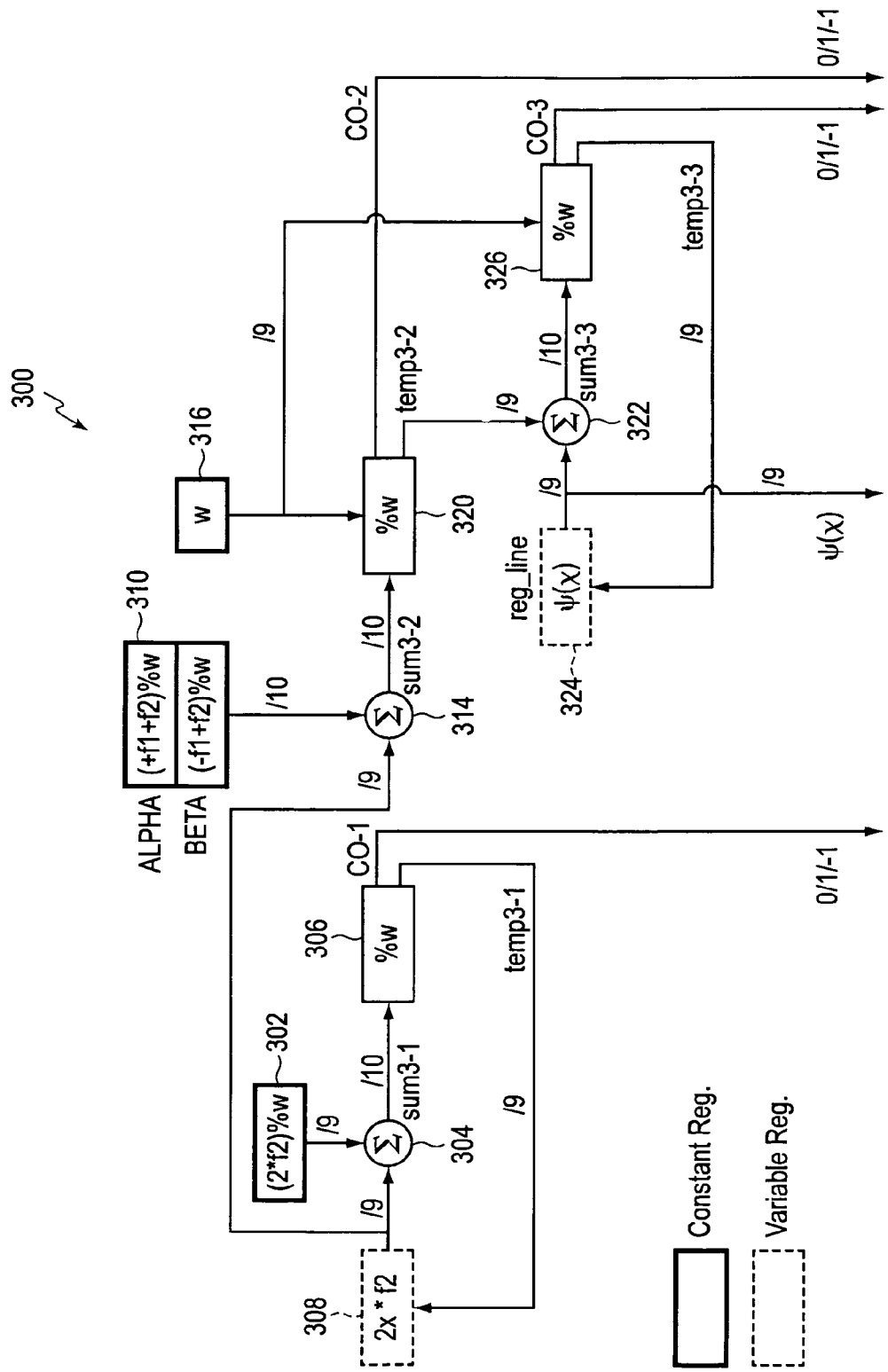
FIG. 3 is a diagram of an example state machine implemented by the QPP row address generating state machine introduced in FIG. 2.

FIG. 3 is a diagram of an example state machine implemented by the QPP row address generating state machine 208 describe with respect to FIG. 2. QPP row address generating state machine 208 may produce a 9-bit row address each scan cycle, e.g., each alpha scan cycle, or beta scan cycle, described above. A 9-bit row address is sufficient because, as described above, the LTE standards do not allow the systematic storage matrix to exceed 384 rows. As described above, the row address generated by QPP row address generating state machine 208 for each scan cycle, i.e., by implementing the state machine shown in FIG. 3, is common to all BCJRs as can be seen from the equation below:

$$\Psi(x+n*w) = [f1*(x+n*w) + f2*(x+n*w)^{\wedge}2]\%w \quad \text{Eq. 2}$$
$$= [f1*x + f2*x^{\wedge}2 + w*\text{integer}]\%w$$
$$= [f1*x + f2*x^{\wedge}2]\%w = \Psi(x)$$

Where, $\Psi(x)=\pi(x) \% w$ denotes the inter-leaved matrix line number for bit number x (0<=x<K).

To produce $\Psi(x+1)$ or $\Psi(x-1)$ in a recursive manner starting from $\Psi(x)$, a state machine with two accumulators can be used, which is based on the equation below:

$$\Psi(x \pm 1) = [f1*(x \pm 1) + f2*(x \pm 1)^{\wedge}2]\%w \quad \text{Eq. 3}$$
$$= [f1*x + f2*x^{\wedge}2 \pm f1 \pm 2x*f2 + f2]\%w$$
$$= \Psi(x) + (\pm f1 \pm 2x*f2 + f2)\%w$$

The example state machine shown in FIG. 3, which may be included within QPP row address generating state machine 208 may be used to implement the recursive process described by equation 3. By implementing such an example state machine QPP row address generating state machine 208 may produce a row address $\Psi(x)$ for each scan cycle.

As shown in FIG. 3, a state machine capable of implementing equation 3 to determine both beta scan and alpha scan row addresses may be implemented with 3 constant registers, 2 variable registers, or accumulators, 3 summation circuits, and 3 modulo-lite circuits, i.e., X % N circuits. Such an implementation requires a far smaller footprint that would be required to generate QPP row addresses using the straight forward, use of multipliers and dividers. Further, since the QPP interleaving algorithm is pseudorandom, the state machine can leverage off knowledge of the previously determined row address, resulting in a reduction in the chip hardware requirements needed to implement the QPP algorithm, resulting in a reduced hardware footprint, reduced power consumption, less heat production and an improved time response.

As shown in FIG. 3, a state machine capable of implementing equation 2 to determine both beta scan and alpha scan row addresses may be implemented with 3 constant registers, i.e., constant register 302, constant register 310, and constant register 316; 2 variable registers, or accumulators, i.e., accumulator 308 and accumulator 324; three summation circuits, i.e., summation circuit 304, summation circuit 314, and summation circuit 322, and 3 modulo-lite circuits, i.e., modulo-lite circuit 306, modulo-lite circuit 320, and modulo-lite circuit 326.

In operation, the variable and constant parameter registers of the state machine of FIG. 3, may first be initialized based on values for interleave parameter f1, interleave parameter f2, the number of rows, w, used to store the systematic soft-bits in systematic soft-bit data store 206, and an initial row, $\Psi(x)$. Such parameters may be received from soft-bit decoder controller 201 based on and analysis of the received number of systematic bits received in a received data packet, and knowledge of the number of hardware BCJR engines included in the design of a specific soft-bit decoder 108. For example, based on the number of systematic bits received, soft-bit decoder controller 201 may determine interleave parameter f1, interleave parameter f2 using predetermined data similar to that shown in Table 1, which presents predetermined f1 and f2 interleave values based on the size of a received number of systematic bits, K. Further, based on the number of systematic bits received and the number of hardware BCJR engines included in the design of a specific soft-bit decoder 108, soft-bit decoder controller 201 may determine the number of rows, w, in which the received systematic soft-bits have been stored. Initial row, $\Psi(x)$, may be selected randomly, or may be based on the last row selected by the state machine in a last alpha/beta scan cycle in a previous decoder half-iteration. Table 2 presents a summary of the bit lengths and data ranges for each of the variable parameter and constant parameter definitions shown in FIG. 3. As indicated, in Table 2, each variable parameter and constant parameter shown in FIG. 3/Table 2 may be resolved to an integer number based on the values of one or more of interleaving parameter f1, interleaving parameter f2, and the number of rows, w, or the number of stored systematic soft-bits.

As shown in FIG. 3, and Table 2, regardless of whether QPP row address generating state machine 208 is being initialized to support an alpha scan or a beta scan, constant register 302 may be loaded with a predetermined 9-bit integer between 0 and +383 defined by (2*f1) % w, i.e., (2*f1) modulo w, which is the remainder of the constant (2*f1) divided by the number of systematic soft-bit rows constant, w. Assuming that QPP row address generating state machine 208 is being initialized to support an alpha scan, constant register 310 may be loaded with a predetermined 9-bit integer between 0 and +383 defined by (+f1+f2) % w, however, assuming that QPP row address generating state machine 208 is being initialized to support a beta scan, constant register 310 may be loaded with a predetermined 10-bit integer between −383 and +383 defined by (−f1+f2) % w. Regardless of whether QPP row address generating state machine 208 is being initialized to support an alpha scan or a beta scan, constant register 316 may be loaded with a 5-bit representation of the number of systematic soft-bit rows constant, w.

Further, as shown in FIG. 3, and Table 2, assuming that QPP row address generating state machine 208 is being initialized to support an alpha scan, variable register/accumulator 308 may be loaded with a first predetermined 9-bit integer between 0 and +383 defined by 2x*f2, based on a first value of scan cycle, x, however, assuming that QPP row address generating state machine 208 is being initialized to support a beta scan, variable register/accumulator 308 may be loaded with a second predetermined 9-bit integer between 0 and +383 defined by 2x*f2, based on a second value of scan cycle, x. Regardless of whether QPP row address generating state machine 208 is being initialized to support an alpha scan or a beta scan, variable register/accumulator 324 may be loaded with a first selected row $\Psi(x)$.

TABLE 2

Registers of Row and First Column Address Generators

| Register | Notation | Variable or Constant Range | Comments |
|---|---|---|---|
| w | 9-bit positive | Const. 40 to 384 | Window width. Constant through whole process. |
| b | 5-bit positive | Const. 1 to 32 | Number of BCJR engines. Constant through whole process |
| (+f1 + f2)% w | 9-bit positive | Const. 0 to +383 | Alpha scan |

TABLE 2-continued

Registers of Row and First Column Address Generators

| Register | Notation | Variable or Constant | Range | Comments |
|---|---|---|---|---|
| $(-f1 + f2)\% \, w$ | 10-bit signed | Const. | −383 to +383 | Beta scan |
| $(2 * f2)\% \, w$ | 9-bit positive | Const. | 0 to +383 | Both alpha and beta scan |
| $2x * f2$ | 9-bit positive | Var. | 0 to 383 | Use two pre-calculated values: one for alpha scan and one for beta scan |
| $((+f1 + f2)/w)\% \, b$ | 4-bit positive | Const. | 0 to +7 | Alpha scan |
| $((-f1 + f2)/w)\% \, b$ | 4-bit positive | Const. | 0 to +7 | Beta scan |
| $((2 * f2)/w)\% \, b$ | 4-bit positive | Const. | 0 to +14 | Both alpha and beta scan |
| $(2x * f2/w)\% \, b$ | 4-bit positive | Var. | 0 to 15 | Use two pre-calculated values: one for alpha scan and one for beta scan |
| $\Psi(x)$ | 9-bit positive | Var. | 0 to 383 | Use two pre-calculated values: one for alpha scan and one for beta scan |
| $\pounds 0(x)$ | 4-bit positive | Var. | 0 to 15 | Use two pre-calculated values: one for alpha scan and one for beta scan |

In operation, in each successive alpha scan cycle, the contents of register/accumulator 308 may be summed with the contents of register 302 by summation function 304 to produce a 10-bit sum, sum3-1, that may be processed by modulo-lite function 306 which is preloaded to divide the incoming value by the number of systematic soft-bit rows, w, to produce a 9-bit remainder, temp3-1, and a 2-bit carry-out, CO-1. Further, the 9-bit contents of register/accumulator 308 may be summed with the 10-bit contents of register 310 by summation function 314 to produce a 10-bit sum, sum3-2, that may be processed by modulo-lite function 320 which is preloaded to divide the incoming value by the number of systematic soft-bit rows, w, to produce a 9-bit remainder, temp3-2, and a 2-bit carry-out, CO-2. In addition, the 9-bit contents of register/accumulator 324 may be summed with the 9-bit output, temp3-2, of modulo-lite function 320 to produce a 10-bit sum, sum3-3, that may be processed by modulo-lite function 326 which is preloaded to divide the incoming value by the number of systematic soft-bit rows, w, to produce a 9-bit remainder, temp3-3, and a 2-bit carry-out, CO-3.

In each scan cycle, the 9-bit row address stored in 324 may be output as the row address for the current scan cycle and the output of modulo-lite function 326, i.e., temp3-3, may be stored in variable register 324 for output as the row address for the next scan cycle. Further, in each cycle, the 9-bit output of modulo-lite function 306, i.e., temp3-1, may be stored in variable register 308 for use in the next scan cycle. In addition, carry-out values CO-1, CO-2 and CO-3, each of which may be either a −1, 0, or +1, may be shared with QPP first column address generating state machine 210, described in greater detail below with respect to FIG. 4, for use in generating a first column address of the newly determined row address, $\Psi(x)$.

It is noted that all registers shown in FIG. 2 with the exception of register 310, which may contain $(-f1+f2) \% w$ during a beta scan, are always positive, i.e., without a sign bit, and the output of the modulo-lite functions are always positive, i.e., without a sign bit, but the carryout value of the modulo-lite functions, if present, may be −1, 0, or 1.

Further, it is noted that all summation functions are 2's compliment and the "±" notation is used to denote backward, i.e., beta, and forward, i.e., alpha scanning directions, where "+" is used to denote a forward, i.e., alpha scan, and "−" is used to demote a reverse, i.e., beta scan.

In addition, it is noted that the modulo-lite function may always produce positive values within a restricted range, as described in greater detail below, so a 9-bit +10-bit adder may be sufficient. For example, in the forward direction the constant registers may be only 9-bit positive, sign bit always '0,' and the modulo result is always a 9-bit positive value, so that the adder output may be no more than 10-bits and always positive.

It is noted that the values w, b, f1, and f2 may be predefined based on LTE standards as a function of the segment size K. Further, it is noted that the initial value for x depends on the sizes of Δalpha and Δbeta. Therefore, to avoid negative values in the $2x*f2$ register, i.e., register 308, while in an alpha scan, it is necessary that the initial value of register 308 be set to a positive number, e.g., $(2*(-\Delta\alpha+K)*f2) \% w$. For example, if K=6144 and Δα=30 it may be assumed that the alpha scan starts from x=6114 rather than from x=−30.

Figure 4:
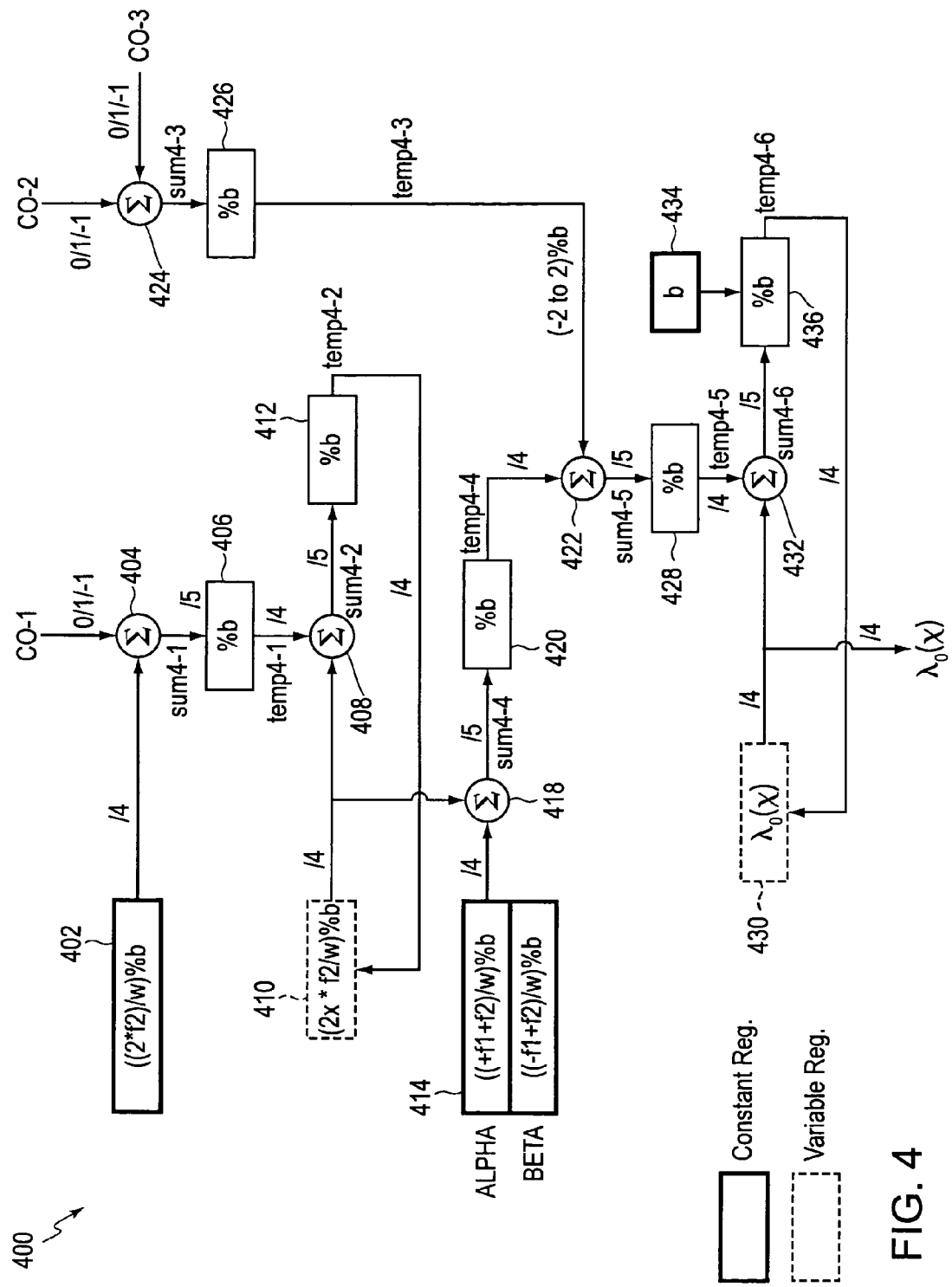
FIG. 4 is a diagram of an example state machine implemented by the QPP first column address generating state machine introduced in FIG. 2.

FIG. 4 is a diagram of an example state machine implemented by the QPP first column address generating state machine 210 describe with respect to FIG. 2. QPP first column address generating state machine 210 may produce, each scan cycle, a 4-bit column address, $\lambda_0(x)$, corresponding to the first column of the systematic soft-bit row identified by row address, $\Psi(x)$, generated by QPP row address generating state machine 208 each cycle.

As shown in FIG. 4, a state machine capable of generating a first column address, $\lambda_0(x)$, corresponding to the first column of the systematic soft-bit row identified by row address, $\Psi(x)$, for both beta scan and alpha scan row addresses may be implemented with 3 constant registers, 2 variable registers, or accumulators, 6 summation circuits, and 6 modulo-lite circuits, i.e., X % N circuits. Such an implementation requires a far smaller footprint that would be required to generate a first QPP column addresses using the straight forward use of multipliers and dividers. Since the QPP interleaving algorithm is pseudorandom, the state machine can leverage off knowledge of the previously determined row address, resulting in a reduction in the chip hardware requirements needed to implement the QPP algorithm, resulting in a reduced hardware footprint, reduced power consumption, less heat production and an improved time response.

As shown in FIG. 4, a state machine capable of generating a first column address, $\lambda_0(x)$, corresponding to the first column of the systematic soft-bit row identified by row address, $\Psi(x)$, for both beta scan and alpha scan row addresses may be implemented with 3 constant registers, i.e., constant register 402, constant register 414 and constant register 434; 2 variable registers, or accumulators, i.e., accumulator 410 and accumulator 430; 6 summation circuits, i.e., summation circuit 404, summation circuit 408, summation circuit 418, summation circuit 422, summation circuit 424, and summation circuit 432; and 6 modulo-lite circuits, i.e., modulo-lite circuit 406, modulo-lite circuit 412, modulo-lite circuit 420, modulo-lite circuit 426, modulo-lite circuit 428, and modulo-lite circuit 436.

In operation, the variable and constant parameter registers of the state machine of FIG. 4, may first be initialized based on values for interleave parameter f1, interleave parameter f2, the number of rows, w, and the number of columns, b, used to store the systematic soft-bits in systematic soft-bit data store 206, and an initial first column, $\lambda_0(x)$. Such parameters may be received from soft-bit decoder controller 201 based on an analysis of the received number of systematic bits received in a received data packet, and knowledge of the number of hardware BCJR engines included in the design of a specific soft-bit decoder 108. For example, based on the number of systematic bits received, soft-bit decoder controller 201 may determine interleave parameter f1 and interleave parameter f2 using predetermined data similar to that shown in Table 1, which presents predetermined f1 and f2 interleave values based on the size of a received number of systematic bits, K. Further, based on the number of systematic bits received and the number of hardware BCJR engines included in the design of a specific soft-bit decoder 108, soft-bit decoder controller 201 may determine the number of rows, w, and the number of columns, b, in which the received systematic soft-bits have been stored. Initial first column, $\lambda_0(x)$, may be selected randomly, or may be based on the last first column selected by the state machine in a last alpha/beta scan cycle in a previous decoder half-iteration. Table 2 presents a summary of the bit lengths and data ranges for each of the variable parameter and constant parameter definitions shown in FIG. 4. As indicated, in Table 2, each variable parameter and constant parameter shown in FIG. 4/Table 2 may be resolved to an integer number based on the values of one or more of interleaving parameter f1, interleaving parameter f2, the number of rows, w, and the number of columns, b, or the stored systematic soft-bits, K.

As shown in FIG. 4, and Table 2, regardless of whether QPP first column address generating state machine 210 is being initialized to support an alpha scan or a beta scan, constant register 402 may be loaded with a predetermined 4-bit integer between 0 and 14 defined by ((2*f2)/w) % b, i.e., ((2*f2)/w) modulo b, which is the remainder of the parameter ((2*f2)/w) divided by the number of systematic soft-bit columns constant, b. Assuming that QPP first column address generating state machine 210 is being initialized to support an alpha scan, constant register 414 may be loaded with a predetermined 4-bit integer between 0 and +7 defined by ((+f1+f2)/w) % b, however, assuming that QPP first column address generating state machine 210 is being initialized to support a beta scan, constant register 414 may be loaded with a predetermined 4-bit integer between 0 and 7 defined by ((−f1+f2)/w) % b. Regardless of whether QPP first column address generating state machine 210 is being initialized to support an alpha scan or a beta scan, constant register 434 may be loaded with a 4-bit representation of the number of systematic soft-bit columns constant, b.

Further, as shown in FIG. 4, and Table 2, assuming that QPP first column address generating state machine 210 is being initialized to support an alpha scan, variable register/accumulator 410 may be loaded with a first predetermined 4-bit integer between 0 and 15 defined by (2x*f2/w) % b, based on a first value of x, however, assuming that QPP first column address generating state machine 210 is being initialized to support a beta scan, variable register/accumulator 410 may be loaded with a second predetermined 4-bit integer between 0 and 15 defined by (2x*f2/w) % b, based on a second value of x. Regardless of whether QPP first column address generating state machine 210 is being initialized to support an alpha scan or a beta scan, variable register/accumulator 430 may be loaded with a 4-bit first selected first column address $\lambda_0(x)$ with a value between 0 and 15.

In operation, in each successive alpha scan cycle, the contents of register/accumulator 402 may be summed with the carry over value CO-1, generated by modulo-lite function 306 described above with respect to FIG. 3, above, by summation function 404 to produce a 5-bit sum, sum4-1, that may be processed by modulo-lite function 406 which is preloaded to divide the incoming value by the number of systematic soft-bit columns, b, to produce a 4-bit remainder, temp4-1. The 4-bit contents of register/accumulator 410 may be summed with the 4-bit remainder, temp4-1, by summation function 408 to produce a 5-bit sum, sum4-2, that may be processed by modulo-lite function 412 which is preloaded to divide the incoming value by the number of systematic soft-bit columns, b, to produce a 4-bit remainder, temp4-2. The contents of carry over value CO-2, generated by modulo-lite function 320 described above with respect to FIG. 3 may be summed with the carry over value CO-3, generated by modulo-lite function 326 described above with respect to FIG. 3, above, by summation function 424 to produce a 4-bit sum, sum4-3, that may be processed by modulo-lite function 426 which is preloaded to divide the incoming value by the number of systematic soft-bit columns, b, to produce a 4-bit remainder, temp4-3.

Further, the 4-bit value of constant register 414 may be summed with the 4-bit output of variable register 410 by summation function 418 to produce a 5-bit sum, sum4-4, that may be processed by modulo-lite function 420 which is preloaded to divide the incoming value by the number of systematic soft-bit columns, b, to produce a 4-bit remainder, temp4-4. The 4-bit value of temp4-4 may be summed with the 4-bit value of temp4-3 by summation function 422 to produce a 5-bit sum, sum4-5, that may be processed by modulo-lite function 428 which is preloaded to divide the incoming value by the number of systematic soft-bit columns, b, to produce a 4-bit remainder, temp4-5. In addition, the 4-bit contents of register/accumulator 430 may be summed with the 4-bit output, temp4-5, of modulo-lite function 428 to produce a 5-bit sum, sum4-6, that may be processed by modulo-lite function 436 which is preloaded to divide the incoming value by the number of systematic soft-bit columns, b, to produce a 4-bit remainder, temp4-6.

In each cycle, the 4-bit first column address stored in 430 may be output as the first column address for the current scan cycle and the output of modulo-lite function 436, i.e., temp4-6, may be stored in variable register 430 for output as the first column address for the next scan cycle. Further, in each cycle, the 4-bit output of modulo-lite function 412, i.e., temp4-2, may be stored in variable register 410 for, use in the next scan cycle in generating the first column address in the next cycle.

Figure 5:
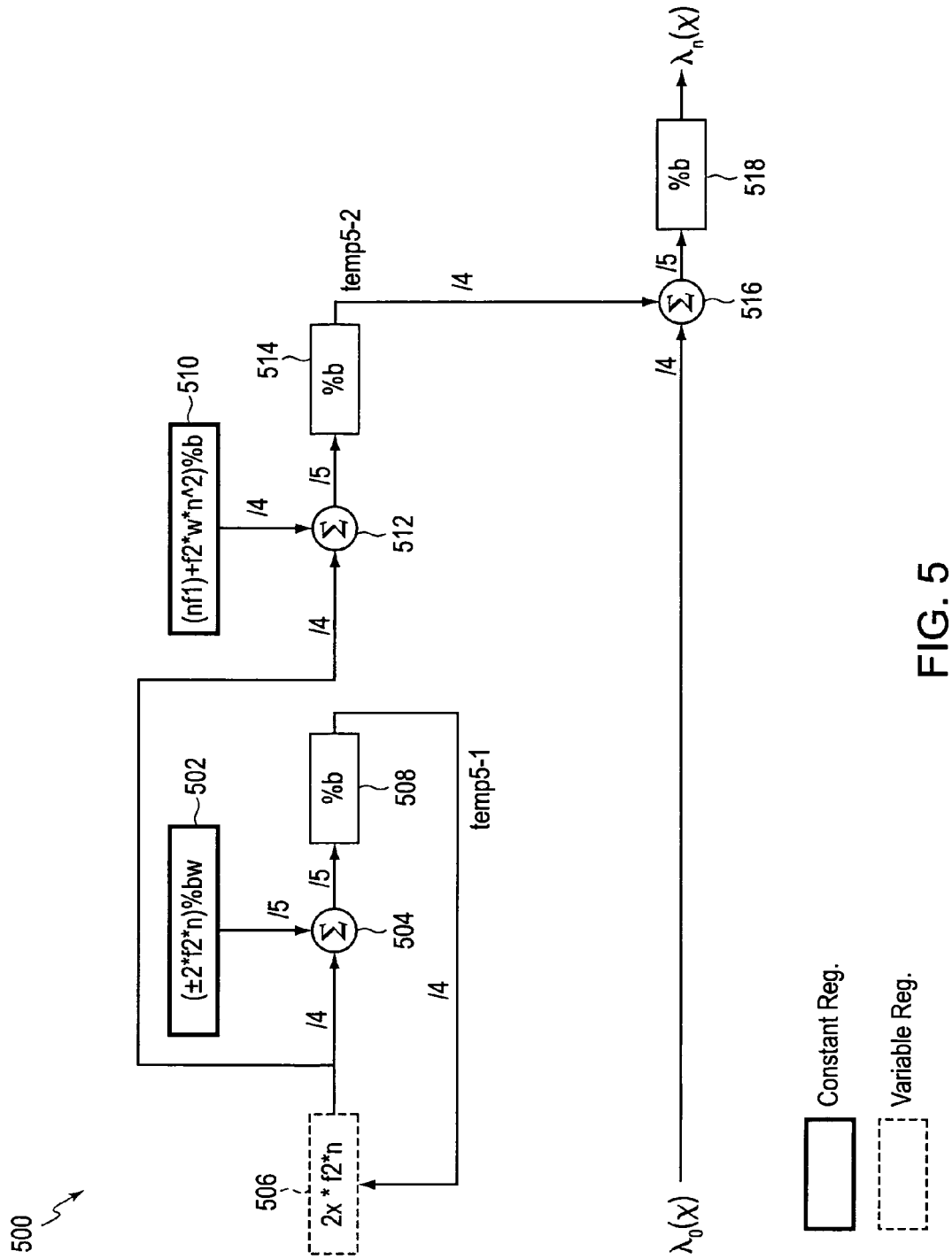
FIG. 5 is a diagram of an example state machine implemented by the QPP multi-column address generating state machine introduced in FIG. 2.

FIG. 5 is a diagram of an example state machine implemented by the QPP multi-column address generating state machine 214 described with respect to FIG. 2. QPP multi-column address generating state machine 214 may produce as many as 15 different 4-bit column addresses each scan cycle. For example, based on the number of BCJR engines included within soft-bit decoder 108, QPP multi-column address generating state machine 214 may include an implementation of QPP column address generating state machine 500 for each BCJR engine. The role of each QPP column address generating state machine 500 is to provide a QPP column address to its assigned BCJR engine each scan cycle.

The column address generated by an implementation of QPP column address generating state machine 500 for its assigned BCJR engine, BCJRn, where 1<=n<=15, may be derived from the equation 4 below.

$$£n(x) = £(x + n*w) \quad \text{Eq. 4}$$

$$= [[f1*(x+n*w) + f2*(x+n*w)^2]/w]\%b$$

$$= \frac{[[f1*x + f2*x^2 + w*(n*f1 + 2n*x*f2 + w*f2*n^2)]/w]\%b}$$

$$= [£0(x) + (n*f1 + 2n*x*f2 + w*f2*n^2)]\%b$$

wherein the "modulo-lite" output is always positive; and the initial value for x depends on the sizes of Δα and Δβ.

QPP multi-column address generating state machine 214 may produce, each scan cycle, a 5-bit column address, $\lambda_n(x)$, for each BCJR engine, BCJRn, where n may range from 1 to 15 and designates a specific BCJR engine from the multiple BCJR engines included within soft-bit decoder 108. An implementation of the state machine shown in FIG. 5 may be provided by QPP multi-column address generating state machine 214 for each BCJR engine included within soft-bit decoder 108. The LTE standard allows as many as 16 BCJR engines to be included within an LTE compliant soft-bit decoder. Therefore, since the column address for one BCJR is provided by QPP first column address generating state machine 210, as described above, QPP multi-column address generating state machine 214 may include as many as 15 implementations of the state machine shown in FIG. 5.

The QPP multi-column address generating state machine 214 may generate column addresses for remaining columns within a currently selected row, $\Psi(x)$, based, in part, on the first column address $\lambda_0(x)$ determined by QPP first column address generating state machine 210. For example, with the exception of the first column address $\lambda_0(x)$ generated for the first column address of a currently selected row address $\Psi(x)$ by QPP first column address generating state machine 210, as described above with respect to FIG. 4, QPP multi-column address generating state machine 214, may generate a column address for all remaining columns within the selected row. The LTE standard limits the number of BCJR engines operating in parallel to 16, therefore assuming a soft-bit decoder design in which all 16 BCJR engines are used, QPP multi-column address generating state machine 214 may generate column addresses $\lambda_1(x)$ to $\lambda_n(x)$, where n=15, for a currently selected row, $\Psi(x)$, each scan cycle.

As shown in FIG. 5, a state machine capable of generating a column address for a single BCJR each scan cycle within an alpha scan, or a beta scan may be implemented with 2 constant registers, 1 variable register, or accumulator, 3 summation circuits, and 3 modulo-lite circuits, i.e., X % N circuits. Such an implementation requires a far smaller footprint that would be required to generate QPP column addresses for a single BCJR engine using the straight forward use of multipliers and dividers. Since the QPP interleaving algorithm is pseudorandom, the state machine may leverage off knowledge of the previously determined first column address and knowledge retained from determining a previous column address for the BCJR in a previous scan cycle.

A state machine capable of generating a multiple column addresses, $\lambda_{1-n}(x)$, corresponding to the 1st to nth column addresses of the systematic soft-bit row identified by row address, $\Psi(x)$, for both beta scan and alpha scan row addresses may be implemented with 2 constant registers, i.e., constant register 502 and constant register 510; 1 variable register, or accumulator, i.e., accumulator 506; 3 summation circuits, i.e., summation circuit 504, summation circuit 512, and summation circuit 516; and 3 modulo-lite circuits, i.e., modulo-lite circuit 508, modulo-lite circuit 514, and modulo-lite circuit 518.

In operation, the variable and constant parameter registers of the state machine of FIG. 5, may first be initialized based on values for interleave parameter f1, interleave parameter f2, the number of rows, w, used to store the systematic soft-bits in systematic soft-bit data store 206, the number of columns, b, used to store the systematic soft-bits in systematic soft-bit data store 206, an initial first column, $\lambda_0(x)$, a scan index number, x, and an assigned BCJR engine number, n. Each state machine implementation may be initialized with a different BCJR identifier, n, ranging in value 1 to b, indicating a BCJR engine for which each respective state machine implementation may generate column addresses.

The initializing parameters, e.g., f1, f2, b, w, n and x, may be received from soft-bit decoder controller 201 based on and analysis of the received number of systematic bits received in a received data packet, and knowledge of the number of hardware BCJR engines included in the design of a specific soft-bit decoder 108. For example, based on the number of systematic bits received, soft-bit decoder controller 201 may determine interleave parameter f1, interleave parameter f2 using predetermined data similar to that shown in Table 1, which presents predetermined f1 and f2 interleave values based on the size of a received number of systematic bits, K. Further, based on the number of systematic bits received and the number of hardware BCJR engines included in the design of a specific soft-bit decoder 108, soft-bit decoder controller 201 may determine the number of rows, w, and the number of columns, b, in which the received systematic soft-bits have been stored. Initial first column, $\lambda_0(x)$, may be generated by and received from QPP first column address generating state machine 210.

As shown in FIG. 5, and Table 3, assuming that an implementation of QPP column address generating state machine 500 within QPP multi-column address generating state machine 214 is being initialized to support an alpha scan, constant register 502 may be loaded with a predetermined 5-bit integer between −15 and +15 defined by (+2*f2*n) % b, however, assuming that an implementation of QPP column address generating state machine 500 within QPP multi-column address generating state machine 214 is being initialized to support a beta scan, constant register 502 may be loaded with a predetermined 5-bit integer between −15 and +15 defined by (−2*f2*n) % b. Regardless of whether an implementation of QPP column address generating state machine 500 is being initialized to support an alpha scan or a beta scan, constant register 510 may be loaded with a 4-bit integer between 0 and +15 defined by (nf1+f2*w*n^2) % b. Further, regardless of whether an implementation of QPP column address generating state machine 500 is being initialized to support an alpha scan or a beta scan, variable register, variable register/accumulator 506 may be loaded with a 4-bit integer between 0 and +15 defined by 2x*f2*n.

In operation, in each successive scan cycle, the contents of register/accumulator 506 may be summed with the contents of constant register 502 by summation function 504 to produce a 5-bit sum that may be processed by modulo-lite function 508 which is preloaded to divide the incoming value by the number of systematic soft-bit columns, b, to produce a 4-bit remainder, temp5-1. The 4-bit contents of register/accumulator 506 may also be summed with the 4-bit contents of constant register 510 by summation function 512 to produce a 5-bit sum that may be processed by modulo-lite function 514 which is preloaded to divide the incoming value by the number of systematic soft-bit columns, b, to produce a 4-bit remainder, temp5-2. The contents of 4-bit, temp5-2, generated by modulo-lite function 514 may be summed with a first selected 4-bit first column address $\lambda_0(x)$, with a value between 0 and 15, to produce a 5-bit sum that may be processed by modulo-lite function 518 which is preloaded to divide the incoming value by the number of systematic soft-bit columns, b, to produce a 4-bit remainder, $\lambda_n(x)$, which is a column address provided to the BCJRn engine to which the implementation of QPP column address generating state machine 500 is assigned.

TABLE 3

Registers of Multi-Column Column Address Generator

| Register | Notation | Variable or Constant | Range | Comments |
| --- | --- | --- | --- | --- |
| (nf1 + f2 * w * n^2)% b | 4-bit positive | Const. | 0 to +15 | |
| (±2 * f2 * n)% b | 5-bit positive | Const. | −15 to +15 | Use +2 for alpha scan and −2 for beta scan |
| 2x * f2 * n | 4-bit positive | Var. | 0 to +15 | |

It is noted that the state machines of QPP address generator 202 may be used to provide BCJR engines with line and column addresses in support of both interleaved half-iteration alpha and beta scans, as well as non-interleaved half-iteration alpha and beta scans. For example, in non-interleaved scan modes, all registers except for the registers (±f1±f2) % w and Ψ(x) may be set to 0, Ψ(x) may be set to contain an initial line address, which may vary depending on whether the scan is an alpha scan or a beta scan, and the register (±f1+f2) % w may be set to contain a +1 in preparation for an alpha scan or a −1 in preparation for a beta scan respectively.

Further, it is noted that, for a non-interleaved scan mode it is not required to operate the column address logic of QPP first column address generating state machine 210 or QPP multi-column address generating state machine 214. Instead, each BCJR engine may use a single assigned column, with the exception of Δalpha and Δbeta parts where it changes to the neighboring column.

Figure 6:
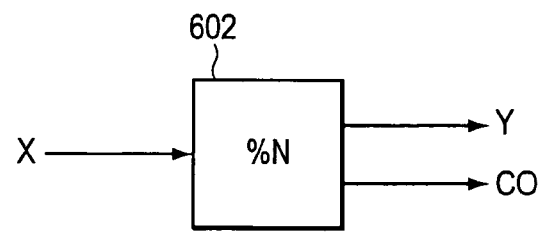
FIG. 6 is a block diagram of an example modulo-lite block introduced in FIG. 3, FIG. 4 and FIG. 5.

FIG. 6 is a block diagram of an example embodiment of the modulo-lite function 602 described above with respect to FIG. 3, FIG. 4 and FIG. 5. As shown in FIG. 6, modulo-lite function 602 may be loaded with a divisor, N, which may be a constant parameter loaded as part of an initialization process of a state machine in which the modulo-lite function is used. As shown in FIG. 6, each scan cycle, the modulo-lite function may receive a dividend, X, and may perform an operation that, for a controlled range of values for X and N, generates an output that is the same as would be generated with a full modulo implementation, but using fewer components, thereby reducing the footprint required to implement the modulo-lite function within an integrated circuit design.

In one example embodiment, the input X should be in the range −N to (N−1) in order for the output to mimic that of a full modulo function implementation. The advantage of this implementation is the fact that it is cost-effective and provides an immediate output, compared to a full modulo function, which would require use of a divider. The output, Y, of the modulo-lite function 602 may be positive, in the range 0 to N−1. The carry out value CO, of modulo-lite function 602 may be 1 when X>=N, −1 when X<0, or 0 otherwise.

Figure 7:
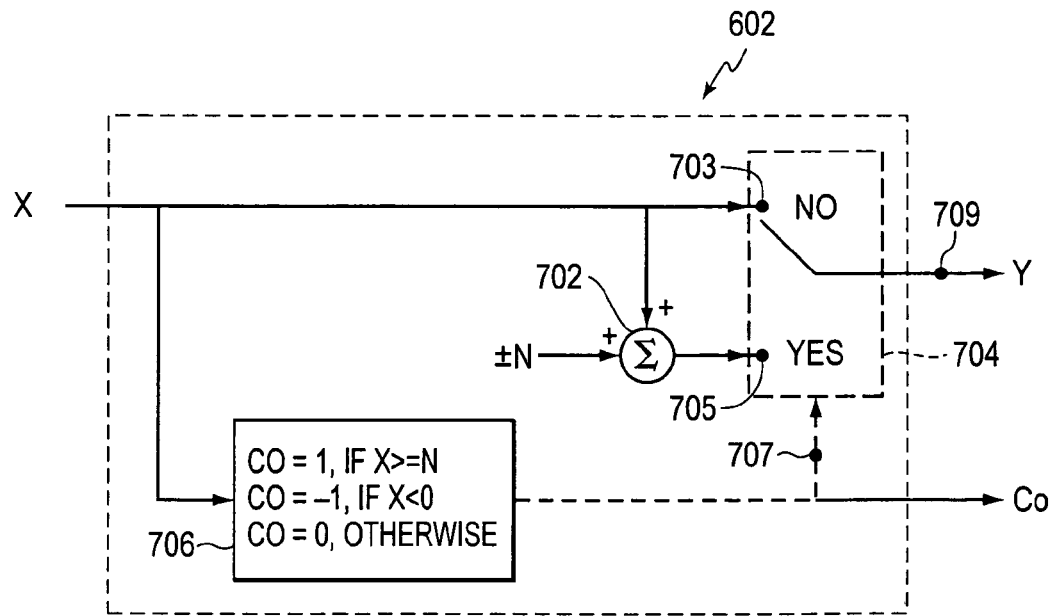
FIG. 7 is a detail block diagram of the example modulo-lite block of FIG. 6.

FIG. 7 is a detailed schematic diagram of the example embodiment of the modulo-lite function 602 described above with respect to FIG. 6. As shown in FIG. 7, modulo-lite function 602 may be implemented with a single summation function 702, a single logic controlled switch 704, and a single logic block 706. As shown in FIG. 7, logic controlled switch 704 may be controlled by the value of carry-out value CO. In one example embodiment, logic controlled switch 704 may connect node 703 to node 709 when the value of carry-out value CO is low, or zero, and may connect node 705 to node 709 when the value of carry-out value CO is either 1 or −1. Further, in one example embodiment, logic block 706 may generate a 1 on carry-out value CO if the input dividend X is greater than or equal to the divisor N, may generate a −1 on carry-out value CO if the input dividend X is less than 0, and may generate a 0 on carry-out value CO if the input dividend X is less than divisor N and greater than or equal to 0.

In operation, every scan cycle a dividend value X may be received. The received dividend value may be presented at node 703. Further, the received dividend value may be presented to logic block 706 to produce a 1 at node 707, if dividend X is greater than or equal to divisor N, to produce a −1 at node 707, if dividend X is less than 0, and to produce a 0 at node 707, if dividend X is less than divisor N and greater than or equal to 0. In addition, if the scan cycle is part of an alpha scan, dividend X may be added to −N, to produce X−N at node 705, however, if the scan cycle is part of a beta scan, dividend X may be added to N, to produce X+N at node 705.

Accordingly, if the value of the carry-out value at node 707 is 1 or −1, the output Y at node 709 is equal to the output of summation function 702 at node 704; however, if the value of the carry-out value at node 707 is 0, the output Y at node 709 is equal to the value of dividend X.

The modulo-lite function described above with respect to FIG. 7 and FIG. 8 may be used in place of a straight forward modulo function in state machines in which the value of the dividend, X, is known to be in the range of −N to N+1. So long as the output of the dividend, X, remains in the range of −N to N+1, the output of the modulo-lite function will be the same as that of a fully implemented modulo function. However, the described modulo-lite may be implemented with a smaller footprint than a modulo function that requires the use of a division function, and may provide an immediate output.

Figure 8:
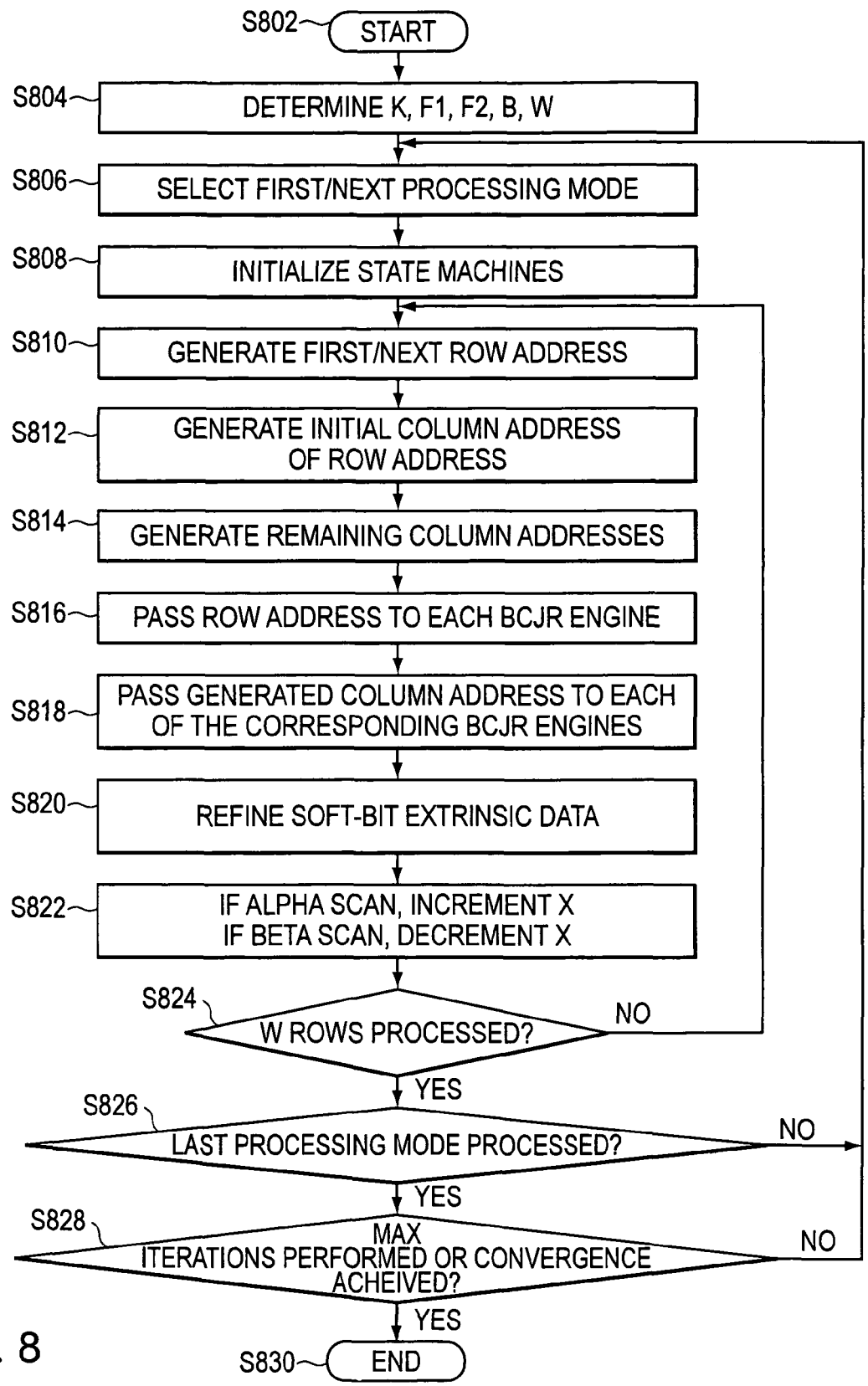
FIG. 8 shows a flow-chart of an example process example that may be performed by the example soft-bit decoder introduced in FIG. 2.

FIG. 8 shows a flow-chart of an example process example that may be performed by the example soft-bit decoder described above with respect to FIG. 2. As shown in FIG. 8, operation of the method begins at step S802 and proceeds to step S804.

In step S804, the soft-bit decoder controller 201 may determine, based on the number of soft-bits received in a systematic soft-bit subblock, K, a first interleaver parameter f1, and a second interleaver parameter f2, as well as a number of columns, b, and number of rows, w, into which the received systematic bits have been stored within the systematic soft-bit data store, and operation of the method continues to step S806.

In step S806, the soft-bit decoder controller 201 may select a first/next processing mode, such as an interleaved alpha scan mode, interleaved beta scan mode, non-interleaved alpha scan mode or non-interleaved beta scan mode, and operation of the method continues to step S808.

In step S808, the soft-bit decoder controller 201 may initialize the state machines of QPP address generator 202 based on the determined processing mode and parameters, and operation of the method continues to step S810.

In step S810, QPP row address generating state machine 208 may generate a first/next row address, and operation of the method continues to step S812.

In step S812, QPP first column address generating state machine 210 may generate an initial column address of the current row address, and operation of the method continues to step S814.

In step S814, QPP multi-column address generating state machine 214 may generate remaining column addresses for the current row address based, in part, on the initial column address of the current row address, and operation of the method continues to step S816.

In step S816, QPP row address generating state machine 208 may pass a row address to each BCJR engine, and operation of the method continues to step S818.

In step S818, QPP first column address generating state machine 210 and QPP multi-column address generating state machine 214 may pass a generated column address to each corresponding BCJR engine, and operation of the method continues to step S820.

In step S820, the respective BCJR engines process their respective soft-bits and update extrinsic data associated with their respective soft-bit, and operation of the method continues to step S822.

In step S822, in preparation for the next scan cycle, soft-bit decoder controller 201 may increment the scan cycle index, x, if the processing mode is an alpha scan mode, or may decrement the scan cycle index, x, if the processing mode is a beta scan mode, and operation of the method continues to step S824.

If, in step S824, soft-bit decoder controller 201 determines that all W rows to be processed by the scan are completed, operation of the method continues to step S826, otherwise, operation of the method continues to step S810.

If, in step S826, soft-bit decoder controller 201 determines that the last processing mode has been performed, i.e., both half-iterations of a decoder iteration have been completed, operation of the method continues to step S828, otherwise, operation of the method continues to step S806.

If, in step S828, soft-bit decoder controller 201 determines that a maximum number of decoder iterations have been performed, or that the extrinsic data produced by both the interleaved half-iterations and non-interleaved half-iteration have converged, operation of the method continues to step S830 and the operation of the method terminates, otherwise, operation of the method continues to step S806.

Figure 9:
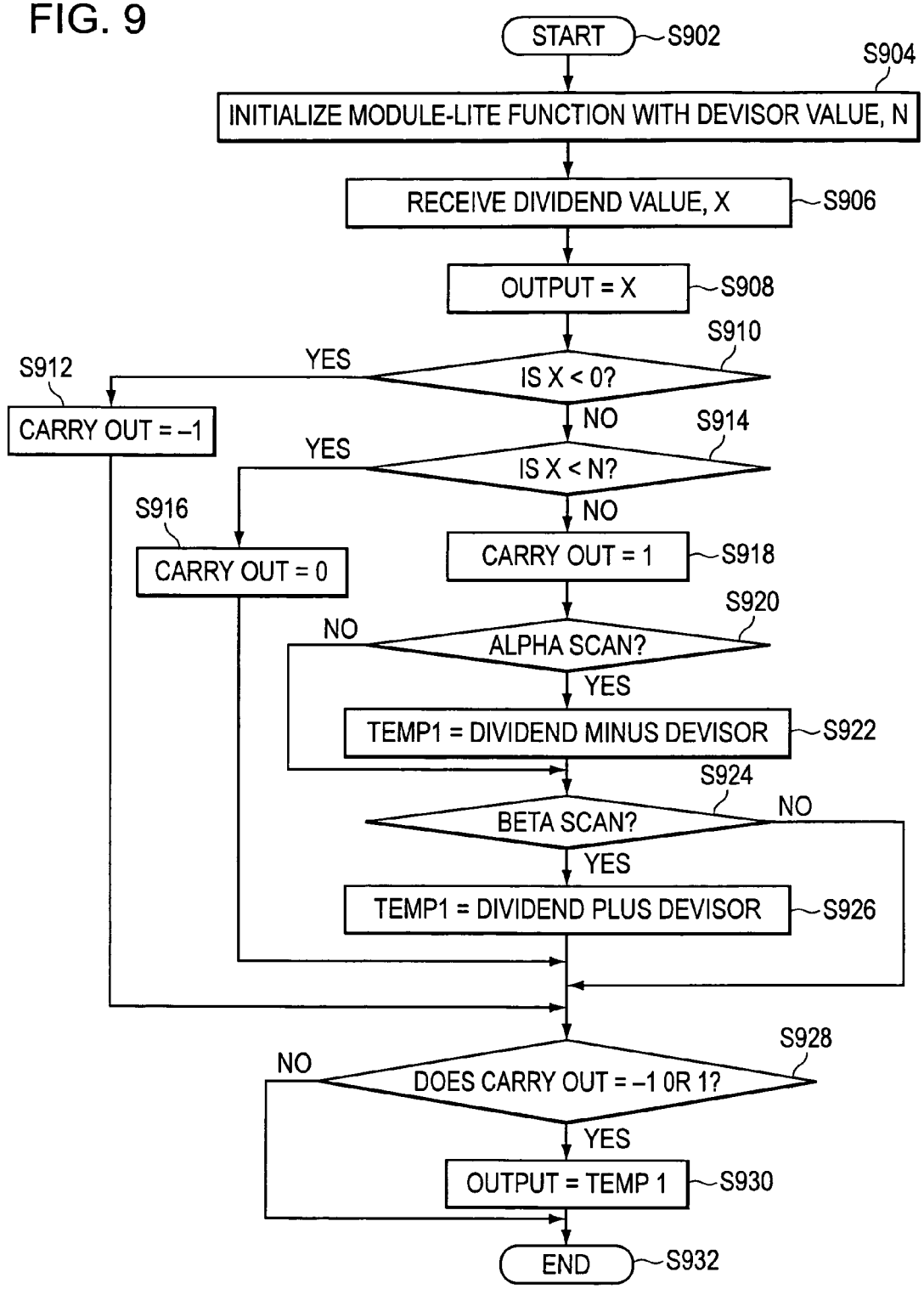
FIG. 9 shows a flow-chart of an example process that may be performed by the modulo-lite block introduced in FIG. 6 and FIG. 7.

FIG. 9 shows a flow-chart of an example process equivalent to that performed by the modulo-lite block introduced in FIG. 6 and FIG. 7. It is noted, however, that, as described above, the modulo-lite function is implemented with hardware circuits, not programmed logic of the sort represented in FIG. 9. Nevertheless, the flow-chart shown in FIG. 9 is provided for its explanatory value because the process flow of FIG. 9 represents the equivalent logic that is inherent within the hardware implementation of the modulo lite circuit described above with respect to FIG. 7.

As shown in FIG. 9, operation of the method begins at step S902 and proceeds to step S904.

In step S904, the modulo-lite function may be initialized with a divisor value, N, and operation of the method continues to step S906.

In step S906, the modulo-lite function may be receive a dividend value, X, and operation of the method continues to step S908.

In step S908, the output, Y, of the modulo-lite function, may be set to the received dividend value, X, and operation of the method continues to step S910.

If, in step S910, the dividend value, X, is determined to be less than zero, operation of the method continues to step S912, otherwise, operation of the method continues to step S914.

In step S912, the carry-out value of the modulo-lite function may be set to −1, and operation of the method continues to step S928.

If, in step S914, the dividend value, X, is determined to be less than the divisor value, N, operation of the method continues to step S916, otherwise, operation of the method continues to step S918.

In step S916, the carry-out value of the modulo-lite function may be set to 0, and operation of the method continues to step S928.

In step S918, the carry-out value of the modulo-lite function may be set to 1, and operation of the method continues to step S920.

If, in step S920, the decoder is performing a half-iteration alpha scan, operation of the method continues to step S922, otherwise, operation of the method continues to step S924.

In step S922, a temporary variable TEMP1 may be set to the value of the dividend, X, minus the value of the divisor, N, and operation of the method continues to step S924.

If, in step S924, the decoder is performing a half-iteration beta scan, operation of the method continues to step S926, otherwise, operation of the method continues to step S928.

In step S926, the temporary variable TEMP1 may be set to the value of the dividend, X, plus the value of the divisor, N, and operation of the method continues to step S928.

If, in step S928, the carry-out value is determined to be 1 or −1, operation of the method continues to step S930, otherwise operation of the method continues to step S932, and operation of the method terminates.

In step S930 the output of the modulo-lite function may be reset to the value of TEMP1, and operation of the method continues to step S932 and terminates.

It is noted that embodiments of the described RF receiver turbo decoding unit and state machine based QPP interleaver are compliant with emerging communications standards, e.g., 3rd Generation Partnership Project (3GPP) Long Term Evolution (LTE) and LTE advanced standards, that require transceivers to apply turbo coding to transmitted data packets.

Further, it is noted that the described 3GPP LTE and LTE advanced compliant turbo decoding unit and state machine based QPP interleaver may be included in both mobile, e.g. user equipment, and stationary 3GPP LTE and LTE advanced standards compliant receivers and transceivers.

For purposes of explanation in the above description, numerous specific details are set forth in order to provide a thorough understanding of the state machine based QPP interleaver and the QPP turbo decoder in which the QPP interleaver may be used. It will be apparent, however, to one skilled in the art that the state machine based QPP interleaver and the QPP turbo decoder in which the QPP interleaver may be used may be practiced without these specific details. In other instances, well-known structures and devices are shown in block diagram form in order to avoid obscuring the features of state machine based QPP interleaver and the QPP turbo decoder in which the QPP interleaver may be used.

While the state machine based QPP interleaver and the QPP turbo decoder in which the QPP interleaver may be used have been described in conjunction with the specific embodiments thereof, it is evident that many alternatives, modifications, and variations will be apparent to those skilled in the art. Accordingly, embodiments of the state machine based QPP interleaver and the QPP turbo decoder in which the QPP interleaver may be used, as set forth herein, are intended to be illustrative, not limiting. There are changes that may be made without departing from the spirit and scope of the invention.

What is claimed is:

1. A QPP interleaver, comprising:
  a decoder hardware;
  a state machine configured to use recursive calculation logic to determine a row address for a plurality of stored systematic soft-bits processed during a scan cycle of a half-iteration scan of the decoder hardware scan operation; and
  a controller configured to initialize the state machine and to control operation of the state machine during a decoding process that includes a plurality of scan cycles.

2. The QPP interleaver of claim 1, wherein the recursive calculation logic comprises:
  a plurality of adders;
  a plurality of accumulators; and
  a plurality of modulo blocks.

3. The QPP interleaver of claim 2, wherein at least one of the plurality of modulo blocks comprises:
  an adder;
  a logic controlled switch; and
  a logic block that controls the logic controlled switch.

4. The QPP interleaver of claim 2, wherein at least one of the plurality of modulo blocks does not include one of a multiplier circuit or a divider circuit.

5. The QPP interleaver of claim 1, wherein the controller is configured to initialize the state machine recursive calculation logic with at least one of:

a first interleave parameter and a second interleave parameter based on a number of bits within a received systematic bit packet;
a number of rows used to store a received systematic bit subpacket within a systematic soft-bit data store; and
a number of columns used to store a received systematic bit subpacket within the systematic soft-bit data store.

6. The QPP interleaver of claim 1, wherein the controller is configured to monitor the state machine recursive calculation logic and to control operation of the state machine recursive calculation logic by controlling at least one of:
a processing mode;
a scan cycle index;
a completion of a decoder half-iteration alpha scan;
a completion of a decoder half-iteration beta scan;
a completion of a decoder iteration;
a completion of a maximum number of decoder iterations; and
a determination of whether extrinsic data generated by a decoder interleaved half-iteration and a decoder non-interleaved half-iteration have converged.

7. The QPP interleaver of claim 6, wherein the processing mode comprises:
an interleaved alpha scan mode;
an interleaved beta scan mode;
a non-interleaved alpha scan mode; and
a non-interleaved beta scan mode.

8. The QPP interleaver of claim 6, wherein the controller is configured to increment the scan cycle index after an execution of a scan cycle, if the processing mode is an alpha scan mode, and to decrement the scan cycle index after the execution of a scan cycle, if the processing mode is a beta scan mode.

9. The QPP interleaver of claim 1, wherein the state machine recursive calculation logic determines a next row address based, in part, on a previously determined row address.

10. The QPP interleaver of claim 1, wherein the state machine recursive calculation logic is configured to support a half-iteration alpha scan in which the state machine determines each row address in an alpha scan QPP interleaved order.

11. The QPP interleaver of claim 1, wherein the state machine recursive calculation logic is configured to support a half-iteration beta scan in which the state machine determines each row address in a beta scan QPP interleaved order.

12. The QPP interleaver of claim 1, further comprising:
a systematic soft-bit data store that is configured to store systematic soft-bits in association with a unique row address/column address combination.

13. The QPP interleaver of claim 12, wherein the maximum number of columns in the data store is 16 and the maximum number of rows is 384.

14. The QPP interleaver of claim 1, wherein the state machine recursive calculation logic is configured to first determine a row address and a first column address, and then determines additional column addresses based on the determined first column address.

15. A method of QPP turbo decoding a received block of systematic soft-bits, comprising:
determining, based on an output of a state machine that uses recursive calculation logic, a row address for a plurality of stored systematic soft-bits to be processed during a current scan cycle of a half-iteration scan; and
processing with a convolutional decoder hardware a soft-bit identified, in part, by the determined row address, wherein the state machine recursive calculation logic determines a row address for each successive scan cycle of the half-iteration scan in a QPP interleaved order.

16. The method of claim 15, further comprising:
determining, with the state machine, a next row address based, in part, on a previously determined row address.

17. The method of claim 15, further comprising:
configuring the state machine recursive calculation logic to support a half-iteration alpha scan in which the state machine recursive calculation logic determines each row address in an alpha scan QPP interleaved order.

18. The method of claim 15, further comprising:
configuring the state machine recursive calculation logic to support a half-iteration beta scan in which the state machine recursive calculation logic determines each row address in a beta scan QPP interleaved order.

19. The method of claim 15, further comprising:
initializing the state machine recursive calculation logic with a first interleave parameter f1 and a second interleave parameter f2 based on a size of a received subblock of systematic bits.

20. The method of claim 15, further comprising:
storing each systematic soft-bit in a data store in association with a unique row address/column address combination.

21. The method of claim 20, further comprising:
first determining a row address and a first column address, and
determining additional column addresses based on the determined first column address.

22. The method of claim 20, further comprising:
setting the maximum number of columns in the data store to 16 and the maximum number of rows to 384.

23. The method of claim 20, wherein determining a row address for a plurality of stored systematic soft-bits consists of:
recursively performing a plurality of summing operations;
recursively performing a plurality of modulo operations; and
recursively storing generated values in a plurality of registers.

24. The method of claim 23, wherein performing a plurality of modulo operations consists of:
performing a summing operation;
executing a logic block; and
setting a selection switch based on an output of the logic block.

25. A method of QPP turbo decoding a received block of systematic soft-bits, comprising:
setting a processing mode of a state machine recursive calculation logic;
configuring control parameters of the state machine recursive calculation logic based a size of a received subblock of systematic soft-bits and the processing mode;
generating, via the state machine recursive calculation logic, a row address and a first column address based, in part, on a value of a last determined row address;
generating, via the state machine recursive calculation logic, multiple remaining column addresses based, in part, on a value of the first column address;
processing each systematic soft-bit identified with a unique line address/column address combination with one of a plurality of convolutional decoder hardwares; and
improving extrinsic data for a soft-bit based on processing performed by a BCJR processing each respective soft-bit.

26. The method of claim 25, wherein the processing mode is one of QPP interleaved alpha scan mode and QPP interleaved beta scan mode.

27. The method of claim 25, wherein the processing mode is one of non-interleaved alpha scan mode and non-interleaved beta scan mode.

28. The method of claim 25, further comprising:
terminating the turbo decoding upon determining that extrinsic data generated in an interleaved half-iteration has converged with extrinsic data generated in a non-interleaved half-iteration.

29. A turbo code decoding unit, comprising:
an address generator that includes a state machine that is configured to determine a row address for a plurality of stored systematic soft-bits processed during a scan cycle of a half-iteration scan; and
at least one convolutional decoder hardware engine, each decoder hardware engine being configured to process during the scan cycle a soft-bit identified, in part, by the determined row address,
wherein the state machine is configured to determine a row address for each successive scan cycle of the half-iteration scan in a QPP interleaved order.

30. The turbo code decoding unit of claim 29,
wherein the state machine is configured to determine a next row address based, in part, on a previously determined row address.

31. The turbo code decoding unit of claim 29, wherein the state machine may be configured to support a half-iteration alpha scan in which the state machine determines each row address in an alpha scan QPP interleaved order.

32. The turbo code decoding unit of claim 29, wherein the state machine may be configured to support a half-iteration beta scan in which the state machine determines each row address in a beta scan QPP interleaved order.

33. The turbo code decoding unit of claim 29, further comprising:
a controller that is configured to initialize the state machine with a first interleave parameter f1 and a second interleave parameter t2 based on a size of a received subblock of systematic bits.

34. The turbo code decoding unit of claim 29, further comprising:
a systematic soft-bit data store that stores each systematic soft-bits in association with a unique row address/column address combination.

35. The turbo code decoding unit of claim 34, wherein the state machine is configured to first determine a row address and a first column address, and then to determine additional column addresses based on the determined first column address.

36. The turbo code decoding unit of claim 34, wherein the maximum number of columns in the data store is 16 and the maximum number of rows is 384.

37. The turbo code decoding unit of claim 34, wherein the state machine consists of:
a plurality of summation blocks;
a plurality of modulo blocks; and
a plurality of registers.

38. The turbo code decoding unit of claim 37, wherein each of the modulo blocks consists of:
a summation block;
a logic block; and
a selection switch.

39. A transceiver that includes the QPP interleaver of claim 1.

40. The transceiver of claim 39, that is compliant with at least one of 3rd Generation Partnership Project (3GPP) Long Term Evolution (LTE) and LTE advanced standards.

41. The transceiver of claim 40, wherein the transceiver is a mobile transceiver.

* * * * *